United States Patent
Wilk et al.

(10) Patent No.: US 6,897,105 B1
(45) Date of Patent: May 24, 2005

(54) METHOD OF FORMING METAL OXIDE GATE STRUCTURES AND CAPACITOR ELECTRODES

(75) Inventors: Glen D. Wilk, Dallas, TX (US); Robert M. Wallace, Richardson, TX (US); John M. Anthony, Richardson, TX (US); Paul McIntyre, Dallas, TX (US)

(73) Assignee: Texas Instrument Incorporated, Dallas, TX (US)

( * ) Notice: Subject to any disclaimer, the term of this patent is extended or adjusted under 35 U.S.C. 154(b) by 526 days.

(21) Appl. No.: 09/396,642

(22) Filed: Sep. 15, 1999

Related U.S. Application Data

(60) Provisional application No. 60/100,605, filed on Sep. 16, 1998.

(51) Int. Cl.[7] .................... H01L 21/8242; H01L 21/44
(52) U.S. Cl. ...................... 438/240; 438/239; 438/608; 438/957; 438/785
(58) Field of Search ................................. 438/240, 239, 438/301, 608, 609, 785, 771, 957

(56) References Cited

U.S. PATENT DOCUMENTS

| | | | |
|---|---|---|---|
| 4,285,761 A | * | 8/1981 | Fatula, Jr. et al. |
| 4,717,625 A | * | 1/1988 | Watakabe et al. |
| 5,080,882 A | * | 1/1992 | Yoshimoto et al. |
| 5,384,729 A | | 1/1995 | Sameshima .................. 365/145 |
| 5,423,944 A | * | 6/1995 | Wong |
| 5,554,564 A | * | 9/1996 | Nishioka et al. |
| 5,609,927 A | * | 3/1997 | Summerfelt et al. ......... 427/553 |
| 5,880,029 A | * | 3/1999 | Eisenbeiser et al. ........ 438/694 |
| 6,018,065 A | * | 1/2000 | Baum et al. ................. 556/136 |
| 6,025,257 A | * | 2/2000 | Jeon ........................... 438/608 |
| 6,168,980 B1 | * | 1/2001 | Yamazaki et al. .......... 438/162 |

* cited by examiner

*Primary Examiner*—John F. Niebling
*Assistant Examiner*—Ron Pompey
(74) *Attorney, Agent, or Firm*—Wade James Brady, III; Frederick J. Telecky, Jr.

(57) ABSTRACT

An embodiment of the instant invention is a method of forming a electrically conductive structure insulatively disposed from a second structure, the method comprising: providing the second structure; forming the electrically conductive structure of a material (step 118 of FIG. 1) that remains substantially conductive after it is oxidized; forming an electrically insulative layer (step 116 of FIG. 1) between the second structure and the conductive structure; and oxidizing the conductive structure by subjecting it to an ozone containing atmosphere for a duration of time and at a first temperature.

8 Claims, 2 Drawing Sheets

METHOD OF FORMING METAL OXIDE GATE STRUCTURES AND CAPACITOR ELECTRODES

CROSS-REFERENCE TO RELATED PATENT/PATENT APPLICATIONS

This application claims priority under 35 USC §119(e)(1) of provisional application No. 60/100,605 filed Sep. 16, 1998.

The following commonly assigned patent/patent applications are hereby incorporated herein by reference:

| Patent No./Serial No. | Filing Date | TI Case No. |
|---|---|---|
|  | //1996 | TI-22027 |
|  | //1998 | TI-22748 |

FIELD OF THE INVENTION

The instant invention pertains to semiconductor device fabrication and processing and more specifically to a method of fabricating a metal oxide gate structure.

BACKGROUND OF THE INVENTION

As electronic devices become more and more complex, the need for greater and greater numbers of transistors on the device is increased. In addition, power consumption needs to be reduced while speed needs to be increased. At least part of the answer to these requirements involves reducing the area that each transistor occupies. However, this may adversely affect one or more of the other requirements. More specifically, as the transistors are scaled down, the gate structure is also scaled down and this increases the resistance of the gate. Hence, the power consumption is increased and the speed of the device is decreased.

Several attempts to reduce the sheet resistivity of the gate structures have been made in the past. First, the polycrystalline silicon was more heavily doped with either n-type or p-type dopants. Then, the upper portion of the gate was silicided with tungsten or titanium. Presently, cobalt silicide is being used so as to keep the resistivity down for smaller geometries. The next likely solution will involve metal gate structures.

Metal gate structures provide lower sheet resistivity virtually irrespective of the width of the gate. However, many metal gate materials have problems which must be overcome before they can be implemented in a standard semiconductor processing flow. One problem is that many metals are unstable next to $SiO_2$, which is commonly used for the gate dielectric layer. Another problem is that many metals become less conductive when they are oxidized. It is not feasible to avoid exposing the gate structure to an oxidizing atmosphere. This is especially true if a high dielectric constant (high-k) material is used for the gate insulating layer, because most of the commonly used high-k materials require an oxygen anneal after the material is deposited. Hence, the gate material will, inevitably, be subjected to sort of oxidizing atmosphere.

SUMMARY OF THE INVENTION

An embodiment of the instant invention is a method of forming a electrically conductive structure insulatively disposed from a second structure, the method comprising: providing the second structure; forming the electrically conductive structure of a material that remains substantially conductive after it is oxidized; forming an electrically insulative layer between the second structure and the conductive structure; and oxidizing the conductive structure by subjecting it to an ozone containing atmosphere for a duration of time and at a first temperature. Preferably, the conductive structure is comprised of: Ir, Ru, Rh, and any combination thereof; and the electrically insulative layer is comprised of: tantalum pentoxide, BST, PZT, a silicate, an oxide, a nitride, a combination thereof, and a stack of one or more thereof. The step of subjecting the conductive structure to an ozone containing atmosphere is comprised of either: using ultraviolet emission and an oxygen ambient to form the ozone containing atmosphere over the electrically conductive structure; or subjecting it to a remotely formed ozone. Preferably, the duration of the oxidizing step is a period of time more than 20 minutes but less than 70 minutes, and the wafer temperature is around 20 to 600 C (more preferably 400 to 500 C).

Another embodiment of the instant invention is a method of forming a capacitor over a semiconductor substrate, the method comprising the steps of: forming a dielectric layer between a first conductive electrode comprised of first conductive material and a second conductive electrode comprised of a second conductive material; and oxidizing the second conductive material by subjecting it to an ozone-containing atmosphere for a period of time greater than 20 minutes but less than 70 minutes. Preferably, temperature of the semiconductor substrate during the step of oxidizing the second conductive material is around 20 to 600 C (more preferably around 400 to 500 C). This embodiment of the instant invention may further include the step of: oxidizing the first conductive material by subjecting it to an ozone-containing atmosphere for a period of time greater than 20 minutes but less than 70 minutes.

Another embodiment of the instant invention is a method of forming a transistor over a semiconductor substrate, the method comprising the steps of: forming a conductive gate structure insulatively disposed over the substrate, the conductive gate structure formed of a conductive material; and oxidizing the conductive material by subjecting it to an ozone-containing atmosphere for a period of time greater than 20 minutes but less than 70 minutes. Preferably, the temperature of the semiconductor substrate during the step of oxidizing the conductive material is around 20 to 600 C (more preferably around 400 to 500 C).

BRIEF DESCRIPTION OF THE DRAWINGS

Like reference numerals or symbols in different figures refer to corresponding structures unless indicated otherwise.

DETAILED DESCRIPTION OF THE DRAWINGS

Figure 1:
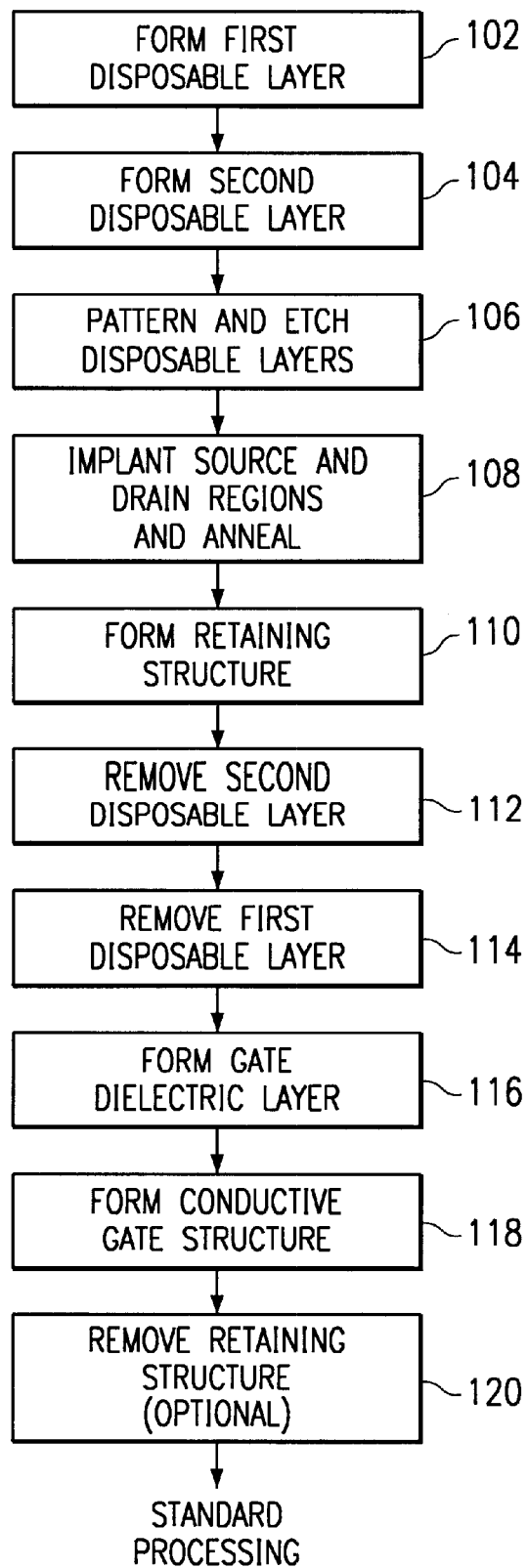
FIG. 1 is a flow diagram of the method of one embodiment of the instant invention.

In essence, the instant invention involves a method of forming a novel conductive structure. The instant invention can be used to form a conductive gate electrode, a top and/or bottom electrode to a capacitor, or any other conductive structure. While the first embodiment is described with reference to a disposable gate structure, the gate structure of this embodiment does not have to be implemented using these disposable structures. The gate structure may be formed using the more traditional method of putting down the gate insulating material and the conductive gate material, etching this stack and then forming the source and drain regions. Either before or after the formation of the source and drain regions and either before or after the etching of the stack, the method of the instant invention may be performed so as to form the oxidized, yet still fairly highly conductive, gate structure. In addition, while the second embodiment is described with reference to a ferroelectric random access memory device (FRAM), the method of the instant invention can be used to form the capacitor electrodes for any type of memory device.

Referring to the embodiment illustrated in FIGS. 2a–d, disposable layer 204 is formed on substrate 202 in step 102. Preferably, disposable layer 204 is comprised of an oxide which is either grown or deposited and is preferably around the same thickness as the final gate dielectric will need to be (preferably around 3 to 20 nm—more preferably around 5 to 10 nm thick). Disposable layer 204 may or may not be comprised of the same material as the actual gate dielectric. In fact, layer 204 may not be disposable, it may actually be the gate dielectric (which is preferably comprised of BST, tantalum pentoxide, a silicate, PZT or any other higher dielectric constant material or an oxide or nitride—or: a combination of any of the above), but this is not the preferred embodiment because in subsequent removal of disposable layer 207 layer 204 may be damaged or at least thinned and this may degrade device performance if layer 204 is used as the gate insulator. Hence, layer 204 is preferably disposable and comprised of a material which is etched with an etchant that does not substantially etch retaining structure 210 or 218. In addition, layer 204 is comprised of a material that is not readily etched by the etchant used to remove disposable structure 206/207. In step 104, disposable layer 206 is formed on disposable layer 204. Preferably, disposable layer 206 is comprised of a material which is etched by an etchant which does not substantially etch layer 204 or retaining structures 210 or 218. More specifically, disposable layer 206 is preferably comprised of nitride, amorphous silicon, or polycrystalline silicon (if layer 204 is an oxide) and is around the same thickness as that of the final conductive portion of the gate structure (around 100 to 300 nm—more preferably around 100 to 200 nm thick). More generally, the thickness of layer 204 does not have to be the same as the gate dielectric layer and the thickness of layer 206 does not have to be the same as the conductive gate structure, but it is important that the thickness of layers 204 and 206, together, is roughly equivalent to that of the gate dielectric and the conductive gate structure, together. In fact, it is possible to use just one disposable layer that has a thickness which is roughly equivalent to the thickness of layer 204 and 206, together. Layers 204 and 206 and retaining structures 210 and 218 may be comprised of any permutation of the following materials so long as layer 204 is etch selective to layer 206 and structure 210 (and 218), layer 206 is etch selective to layer 204 and structure 210 (and 218), and structure 210 (and 218) is etch selective to layers 204 and 206: a nitride (silicon nitride), an oxide ($SiO_2$), polycrystalline silicon, amorphous silicon, or a combination of the above. In a preferred embodiment, layer 204 is comprised of $SiO_2$, layer 206 is comprised of amorphous or polycrystalline silicon, and structure 210 (and 218) is comprised of silicon nitride.

Figure 2A:
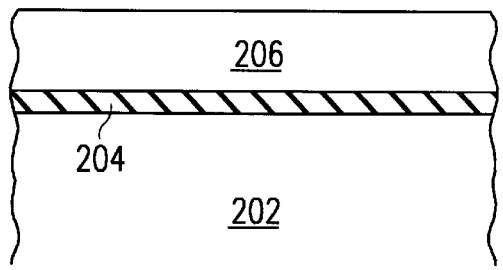
FIGS. 2a–2d are cross-sectional views of a partially-fabricated semiconductor device using the method of the instant invention as illustrated in FIG. 1.
Figure 2B:
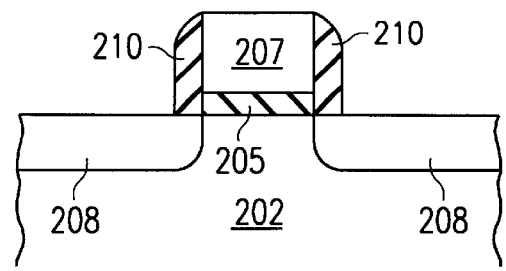

Referring to FIG. 2b, in step 106 layers 204 and 206 are patterned and etched. Preferably, this is performed by forming a photoresist layer on layer 206 and etching or sputtering away the unwanted portions of layer 206 (to form structure 207). Next, either a second etchant or the same sputtering method is utilized to remove any exposed portions of layer 204. This step may be performed before or after the photoresist has been removed.

Referring to step 108, lightly doped regions (not shown) may be formed prior to the formation of retaining structure 210. Source/drain regions 208 may be formed before retaining structure is formed 210. Preferably, step 108 is comprised of implanting dopant into the 202 and activating the dopants by performing an anneal step. Both of these steps can be performed using standard processing techniques, and one of the advantages of performing the anneal step at this point is that the final gate structure is not subjected to this higher temperature step. Retaining structure 210 is formed (step 110), preferably by deposition, so as to abut structures 205 and 207. An anisotropic etch step maybe performed, next, so as to form sidewall structures (as is shown in FIG. 2b) or the entire layer may be left on the wafer. If the entire layer is left on the wafer, then source/drain regions 208 should be implanted prior to the formation of the retaining structure 210 material.

Figure 2C:
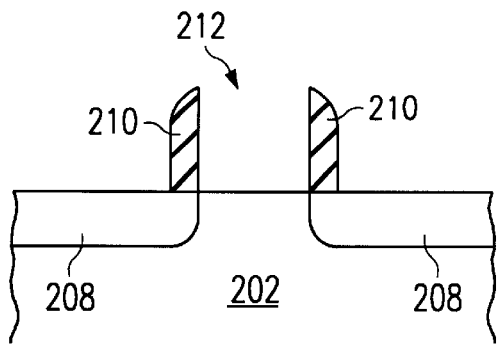

Referring to FIG. 2c, disposable structure 207 is removed in step 112. This is preferably accomplished using an etchant which will not substantially etch retaining structure 210 or disposable structure 205 (or gate dielectric 205 if structure 205 is not disposable). In step 114, layer 205 is removed if it is disposable. If layer 205 is the actual gate insulator then step 114 is not performed. In an alternative embodiment, structure 205 may be comprised of the actual gate dielectric material 214 under a protective overcoat which is comprised of an oxide or a nitride. If this is used, then step 114 would be used to remove this protective overcoat. Please note that if this protective overcoat is utilized, disposable structure 207 should be a little thinner to account for the extra thickness of this protective overcoat.

Figure 2D:
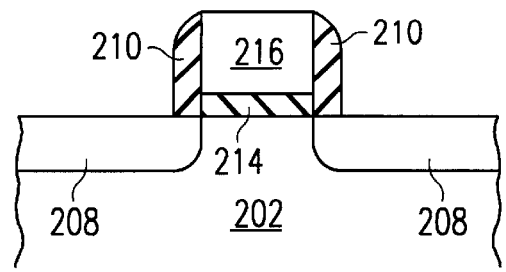
Figure 3:
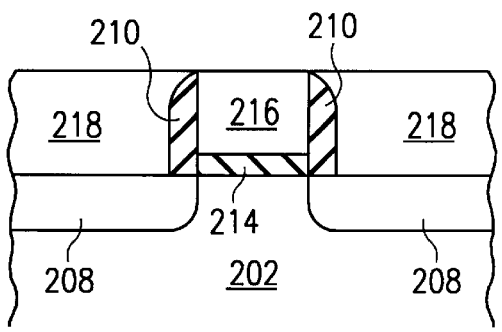
FIG. 3 is a cross-sectional view of an alternate embodiment of the partially-fabricated semiconductor device of FIG. 2d.

Referring to FIG. 2d, gate dielectric 214 is formed in step 116 if structure 205 was disposable. Preferably, gate dielectric 214 is comprised of a higher dielectric constant material (such as BST, tantalum pentoxide, a silicate, or another ferroelectric material), an oxide, a nitride, or a combination of any of the above, and it is preferably on the order of 2 to 20 nm thick (preferably closer to 3 to 10 nm thick—more preferably around 5 to 8.5 nm thick). If BST, tantalum pentoxide, or other material is formed which requires an anneal step in an oxygen ambient is utilized for gate dielectric 214, the anneal is preferably performed between steps 116 and 118.

In step 118, a conductor is formed over the wafer and is etched away in portions other than conductive structure 216. Preferably, conductive structure is comprised of a conductor (preferably a metal) which, when oxidized, remains substantially conductive. More specifically, conductive structure 216 is, preferably comprised of Ir, Ru, or Rh. Either before or after the unwanted portions of the conductor are etched away (step 120) so as to form conductive gate structure 216, the conductor is oxidized using an ozonizer and the method of the instant invention. This is preferably accomplished by either: using an oxygen ambient with a mercury lamp (which emits UV radiation to convert $O_2$ to $O_3$) to create an ozone ambient so as to oxidize all or a portion of the conductor with the wafer temperature, preferably, around 20 to 600 C (more preferably around 400 to 500 C); or remotely forming an ozone and flowing it over the wafer with the wafer temperature, preferably, around 20 to 600 C (more preferably around 400 to 500 C). In order to oxidize a substantial portion (if not all) of conductive structure 216, this process step should be performed for 20 to 70 minutes. However, this time may vary depending on the thickness of structure 216, the temperature, and other processing conditions.

An advantage of the conductive structure of this embodiment of the instant invention is that the conductive oxidized metal can serve as an oxygen source for the gate dielectric material. This is especially important if BST or PZT is used for the gate dielectric, because the oxygen in these two materials tends to migrate out of the material thereby degrading it as a dielectric. The iridium oxide of one embodiment is an especially good source of oxygen for the BST or PZT.

Figure 4:
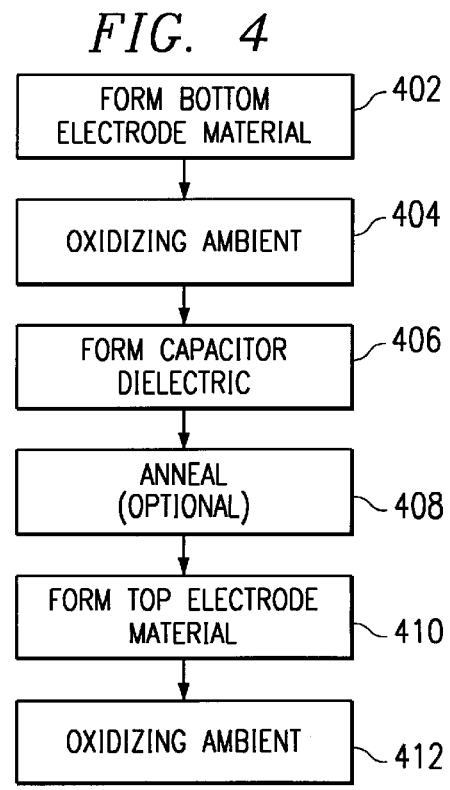
FIG. 4 is a flow diagram of a method of a second embodiment of the instant invention.

The method of the embodiment illustrated in FIG. 4 involves the formation of capacitor. This capacitor may be used in an FRAM, a DRAM, or any other memory device. Prior to step 402, several standard processing steps are, preferably, performed. One of ordinary skill in the art will know, based on the following teachings, which steps should be performed prior to step 402 based on the specific device structure.

Referring to step 402 of FIG. 4, a layer is formed using a conductive material (preferably a metal) which remains substantially conductive after it is oxidized. This layer of material will preferably form one electrode of the capacitor. Preferably, the conductive material is comprised of Ir, Ru, Rh or a combination thereof and is either deposited (by chemical vapor deposition) or by sputtering (preferably using a substantially pure Ir target or a Rh or Ru target). In step 404, the conductive layer is oxidized using the method of the instant invention. This method is preferably performed by either: using ultraviolet emissions from a mercury lamp to create an ozone ambient above the wafer so as to oxidize all or a portion of the conductor (ambient temperature is, preferably, around 20 to 600 C—more preferably around 400 to 500 C); or remotely forming an ozone and flowing it over the wafer (ambient temperature is, preferably, around 20 to 600 C—more preferably around 400 to 500 C). In order to oxidize a substantial portion (if not all) of the conductive layer, this process step should be performed for 20 to 70 minutes. However, this time may vary depending on the thickness of structure 216, the ambient temperature, and other processing conditions.

Referring to step 406, the capacitor dielectric is formed on the oxidized conductive layer. Preferably, the capacitor dielectric is comprised of a higher dielectric constant material, such as a ferroelectric, BST, PZT, tantalum pentoxide, or a silicate, an oxide, a nitride, or a combination thereof. If BST, PZT, or any other material which requires an oxygen anneal is utilized, an anneal in an oxygen ambient is performed, next (step 408). Step 408 can be performed using standard semiconductor processing.

In step 410, a conductive layer is formed on the capacitor dielectric. This material may be comprised of the same material as the bottom conductive material or it may be comprised of a different conductive material. Preferably, they are comprised of the same material which, when oxidized, remains conductive (preferably Ir, Rh, or Ru). Next, this material is oxidized (step 412) using the same method as described for step 404. Please note, that if this second conductive material is not comprised of the same material as the first conductive material, then step 412 may or may not be performed.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of forming an electrically conductive structure insulatively spaced from a second structure, said method comprising the steps of:

providing said second structure;

forming an electrically insulative layer on said second structure;

forming on said electrically insulative layer and spaced from said second structure an unoxidized electrically conductive structure of a material that remains substantially conductive in the oxidized state; and then subjecting said electrically conductive structure and said electrically insulative layer to an ozone-containing atmosphere for a duration of time and at a first temperature sufficient to oxidize said unoxidized electrically conductive structure;

wherein said step of subjecting said electrically conductive structure and said electrically insulative layer to an ozone containing atmosphere is comprised of using ultraviolet emission and an oxygen ambient to form said ozone containing atmosphere over said electrically conductive and said electrically insulative structure.

2. A method of forming an electrically conductive structure insulatively spaced from a second structure, said method comprising the steps of:

providing said second structure;

forming an electrically insulative layer on said second structure;

forming on said electrically insulative layer and spaced from said second structure an unoxidized electrically conductive structure of a material that remains substantially conductive in the oxidized state; and then subjecting said electrically conductive structure and said electrically insulative layer to an ozone-containing atmosphere for a duration of time and at a first temperature sufficient to oxidize said unoxidized electrically conductive structure;

wherein said step of subjecting said electrically conductive structure and said electrically insulative layer to an ozone containing atmosphere is comprised of remotely forming ozone and providing said ozone to said electrically conductive and said electrically insulative structure.

3. A method of forming an electrically conductive structure insulatively spaced from a second structure, said method comprising the steps of:

providing said second structure;

forming an electrically insulative layer on said second structure;

forming on said electrically insulative layer and spaced from said second structure an unoxidized electrically conductive structure of a material that remains substantially conductive in the oxidized state; and then subjecting said electrically conductive structure and said electrically insulative layer to an ozone-containing atmosphere for a duration of time and at a first temperature sufficient to oxidize said unoxidized electrically conductive structure;

wherein said duration of time is a period of time more than 20 minutes but less than 70 minutes.

4. A method of forming an electrically conductive structure insulatively spaced from a second structure, said method comprising the steps of:

providing said second structure;

forming an electrically insulative layer on said second structure;

forming on said electrically insulative layer and spaced from said second structure an unoxidized electrically conductive structure of a material that remains substantially conductive in the oxidized state; and then subjecting said electrically conductive structure and said electrically insulative layer to an ozone-containing atmosphere for a duration of time and at a first temperature sufficient to oxidize said unoxidized electrically conductive structure;

wherein said first temperature is around 400 to 500 C.

5. A method of forming a capacitor over a semiconductor substrate, said method comprising the steps of:

providing a first electrically conductive electrode on said semiconductor substrate;

forming a dielectric layer on said first electrically conductive electrode comprised of a first conductive material;

forming on said dielectric layer a second unoxidized electrically conductive electrode comprised of a second electrically conductive material which remains electrically conductive in the oxidized state; and then oxidizing said second electrically conductive material by subjecting said second electrically conductive material and said dielectric layer to an ozone-containing atmosphere for a period of time greater than 20 minutes but less than 70 minutes.

6. The method of claim 5, wherein the temperature of said semiconductor substrate during said step of oxidizing said second conductive material is around 20 to 600 C.

7. The method of claim 5, wherein the temperature of said semiconductor substrate during said step of oxidizing said second conductive material is around 400 to 500 C.

8. The method of claim 5, further comprising the step of:

oxidizing said first conductive material by subjecting it to an ozone-containing atmosphere for a period of time greater than 20 minutes but less than 70 minutes.

* * * * *